United States Patent
Wu et al.

(10) Patent No.: US 10,483,975 B1
(45) Date of Patent: Nov. 19, 2019

(54) INTEGRATED CIRCUITRY

(71) Applicant: DigWise Technology Corporation, LTD, Hsinchu County (TW)

(72) Inventors: Jingjie Wu, Beijing (CN); Chih-Wen Yang, Hsinchu County (TW); Chung-Ting Yeh, Hsinchu County (TW)

(73) Assignee: DigWise Technology Corporation, LTD, Hsinchu County (TW)

( * ) Notice: Subject to any disclaimer, the term of this patent is extended or adjusted under 35 U.S.C. 154(b) by 0 days.

(21) Appl. No.: 16/378,562

(22) Filed: Apr. 9, 2019

(30) Foreign Application Priority Data

Nov. 6, 2018 (TW) .............................. 107139372 A

(51) Int. Cl.
*H03K 17/687* (2006.01)
*H03K 19/0185* (2006.01)
*H03K 19/0175* (2006.01)

(52) U.S. Cl.
CPC ....... *H03K 19/0185* (2013.01); *H03K 17/687* (2013.01); *H03K 19/017509* (2013.01)

(58) Field of Classification Search
CPC .............. H03K 17/687; H03K 19/0175; H03K 19/017509; H03K 19/0185
USPC ........................... 326/63, 68, 80, 81; 327/333
See application file for complete search history.

(56) References Cited

U.S. PATENT DOCUMENTS

| 5,498,991 A * | 3/1996 | Tanoi ..................... G01R 19/15 327/333 |
| 8,549,339 B2 | 10/2013 | Wolfe et al. |
| 8,643,425 B2 | 2/2014 | Chaudhry et al. |
| 9,960,670 B2 | 5/2018 | Kapoor et al. |

FOREIGN PATENT DOCUMENTS

TW       201618463 A       5/2016

OTHER PUBLICATIONS

Prema Rampuria et al., "Design of Modified Wilson Current Mirror based Level Shifter," International Journal of Engineering Science and Computing, Jun. 2016.

* cited by examiner

*Primary Examiner* — William Hernandez
(74) *Attorney, Agent, or Firm* — CKC & Partners Co., LLC

(57) ABSTRACT

An integrated circuitry includes a first circuit, a second circuit, and a voltage conversion circuit. A first power supply positive terminal of the first circuit is electrically coupled to a power source. The second circuit is electrically coupled in series with the first circuit and the power source. A second power supply positive terminal of the second circuit is electrically coupled to a first power supply negative terminal of the first circuit. The voltage conversion circuit is electrically coupled between the first circuit and the second circuit so as to receive a signal from the first circuit or the second circuit. The voltage conversion circuit converts a voltage value of the signal according to a first low potential signal of the first power supply negative terminal and a second low potential signal of a second power supply negative terminal.

12 Claims, 6 Drawing Sheets

INTEGRATED CIRCUITRY

CROSS-REFERENCE TO RELATED APPLICATION

This application claims priority to Taiwan Application Serial Number 107139372, filed Nov. 6, 2018, which is herein incorporated by reference in its entirety.

BACKGROUND

Technical Field

The present disclosure relates to an integrated circuitry.

Description of Related Art

Integrated circuitry is a technique for miniaturizing electronic components to form a plurality of core circuits on a semiconductor wafer, also name as microcircuits or microchips. Since the integrated circuitry is the core of various electronic devices, the performance of the integrated circuitry has a direct and important influence on the electronic device.

SUMMARY

One aspect of the present disclosure is an integrated circuitry, including a first circuit, a second circuit and a voltage conversion circuit. A first power supply positive terminal of the first circuit is electrically coupled to a power source. The second circuit is electrically coupled in series with the first circuit and the power source. A second power supply positive terminal of the second circuit is electrically coupled to a first power supply negative terminal of the first circuit. A second power supply negative terminal of the second circuit is electrically coupled to a reference potential voltage. The voltage conversion circuit is electrically coupled between the first circuit and the second circuit. The voltage conversion circuit is configured to receive a signal from the first circuit or the second circuit, and convert a voltage value of the signal according to a first low potential signal of the first power supply negative terminal and a second low potential signal of the second power supply negative terminal.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1A:
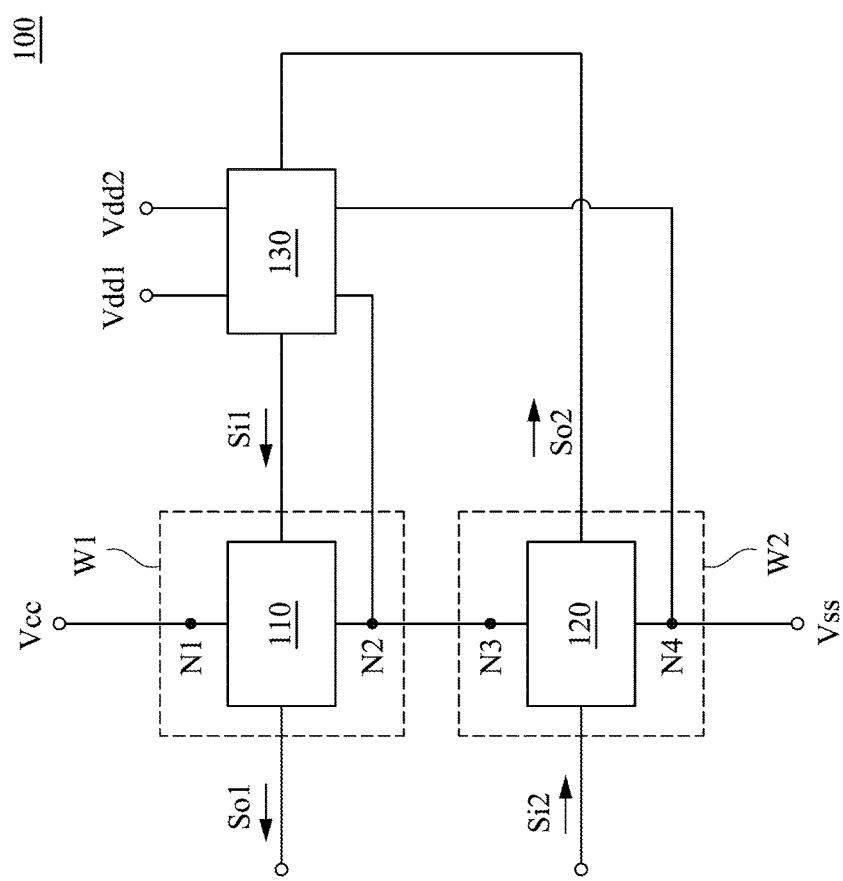
FIG. 1A is a schematic diagram of an integrated circuitry in some embodiments of the present disclosure.

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

The integrated circuitry integrates multiple functional circuits on a semiconductor wafer. For example, a central processing unit (CPU), a graphics processing unit GPU (Graphics Processing Unit), or a wireless communication circuit LTE (Long Term Evolution). The functional circuit is electrically connected to power supply pins of the integrated circuitry to obtain a driving voltage and operate. In the past, the integrated circuitry used a "parallel" design to power functional circuits. That is, the power source (and its power supply pin) is connected in parallel with functional circuits. However, there is currently no integrated circuitry that powers the functional circuits in a "series" manner.

The inventor found that the integrated circuitry powered by "parallel" manner has design limitations. If designing integrated circuitry may powered by "series" manner, it will make the circuitry design more flexible and reduce power consumption. However, there are many obstacles in the design of "series" power supply manner. Because according to the Voltage divider rule, when these functional circuits are connected in series with the power source, the voltage assigned to each functional circuit will be different. That is, the high voltage level and the low voltage level of the supply voltage to each functional circuit will be different. This multi-voltage level (multi-Vdd, wherein Vdd is a common code for high voltage levels) will be one of the problems in designing integrated circuitry for "series" power supply manner.

For example, if the power source supplies a voltage of 1.6 volts, and the integrated circuitry contains three functional circuits, the voltage across each of the functional circuits may be 0.4 volts, 0.8 volts and 1.2 volts. For the first functional circuit, its high voltage level is 0.4 volts and the low voltage level is 0 volts. But for the second functional circuit, its high voltage level will be 0.8 volts and the low voltage level will be 0.4 volts. The signals between functional circuits must be converted by the conversion circuit, otherwise the functional circuits will unable function properly.

Figure 2A:
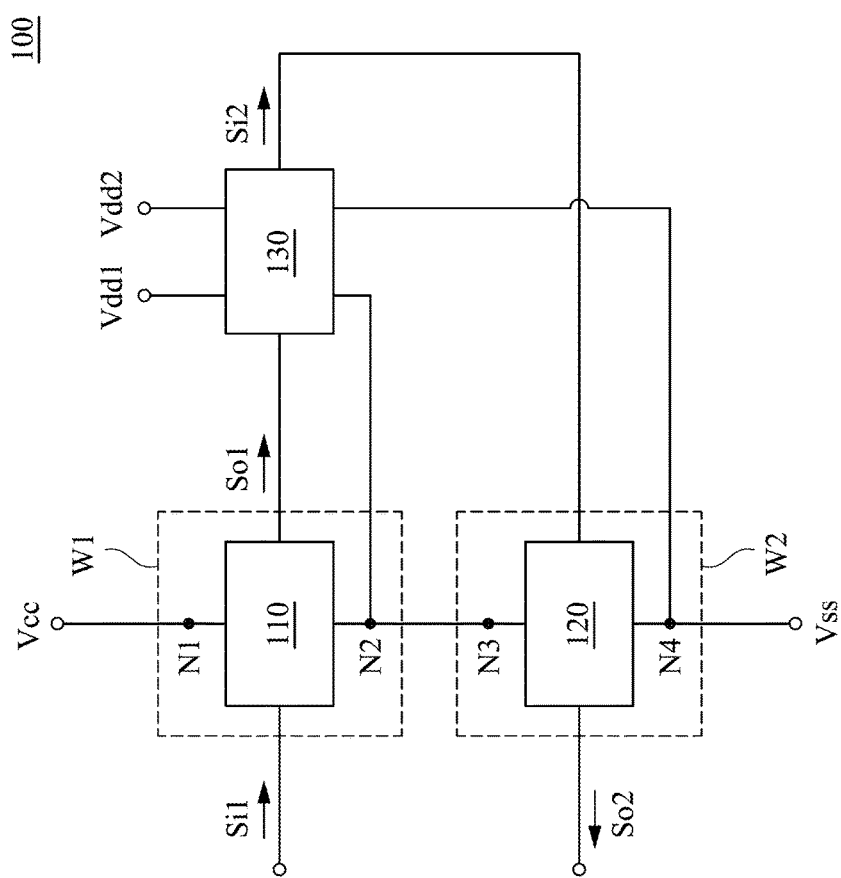
FIG. 2A is a schematic diagram of an integrated circuitry in some embodiments of the present disclosure.

Referring to FIG. 1A and FIG. 2A, which are schematic diagrams of an integrated circuitry in some embodiments of the present disclosure. The integrated circuitry 100 includes a first circuit 110, a second circuit 120 and a voltage conversion circuit 130. The first circuit 110 and the second circuit 120 are the foregoing functional circuits, and may be a central processing unit, a graphics processor, etc., but are not limited thereto.

The first power supply positive terminal N1 of the first circuit 110 is electrically connected to a power supply pin of a semiconductor substrate so as to electrically connect to a power source Vcc. The second circuit 120 is connected in series with the first circuit 110 and the power source Vcc. The second power supply positive terminal N3 of the second circuit 120 is electrically connected to the first power supply negative terminal N2 of the first circuit 110. The second power supply negative terminal N4 of the second circuit 120 is electrically connected to the power supply pin of the semiconductor substrate so as to electrically connect to a reference potential voltage Vss (e.g., ground potential).

The voltage conversion circuit 130 is electrically connected to the first circuit 110 and the second circuit 120, and configured to receive a signal transmitted by the first circuit 110 or the second circuit 120. The power supply terminals of the voltage conversion circuit 130 are respectively electrically connected to the first power supply negative terminal N2 and the second power supply negative terminal N4, so that the voltage conversion circuit 130 may convert a voltage value of the signal according to the first low potential signal of the first power supply negative terminal N2 and the second low potential signal of the second power supply negative terminal N4.

In some embodiments, the voltage conversion circuit 130 is a level shifter, and configured to convert signal between the first circuit 110 and second circuit 120. The conventional level shifter can only level up or level down the signal, for example, converting the 0-1.2 volt signal to 0-2.4 volts. That is, the conventional voltage conversion circuit unable cross the voltage level of the signal, for example, raising the signal from 0-1.2 volts to 1.2-2.4 volts. In the present disclosure, the voltage conversion circuit 130 is electrically connected to the first power supply negative terminal N2 of the first circuit 110 and the second power supply negative terminal N4 of the second circuit 120. In the case that the first circuit 110, the second circuit 120 and the power source Vcc are electrically connected in series, according to the Voltage divider rule, the first power supply negative terminal N2 and the second power supply negative terminal N4 will have different Voltage level. Accordingly, the voltage conversion circuit 130 may change the disable voltage level of the signal in addition to changing the enable voltage level of the signal in order to achieve "series" power supply manner of the integrated circuitry 100.

in some embodiments, the voltage conversion circuit 130 adjusts (level up or level down) the enable voltage level of signal according to the first high potential signal Vdd1 and the second high potential signal Vdd2, and adjusts the disable voltage level of signal according to the first low potential signal and the second low potential signal. In some embodiments, the power supply positive terminals of the voltage conversion circuit 130 are respectively electrically connected to the first power supply positive terminal N1 so as to receive the first high potential signal Vdd1. Power supply positive terminals of the voltage conversion circuit 130 are further electrically connected to the second power supply positive terminal N3 so as to receive a second high potential signal Vdd2. That is, the voltage conversion circuit 130 utilizes the voltage values on the first power supply positive terminal N1 and the voltage values on the second power supply positive terminal N3 as the voltage of the power supply positive terminal. In this way, the number of power wires can be reduced, and the complexity and cost of the integrated circuitry 100 can be improved.

Referring to FIGS. 1A and 2A, in some embodiments, the first circuit 110 is configured to receive the first input signal Si1, and output a first output signal So1 to the voltage conversion circuit 130. The voltage conversion circuit 130 is configured to output a second input signal Si2 to the second circuit 120, and then the second circuit 120 outputs a second output signal So2 accordingly. The above voltage conversion circuit 130 performs a "buck" process as shown in FIG. 2A. In the other circuit, as shown in FIG. 1A, the second circuit 120 is configured to receive the second input signal Si2, and output a second output signal So2 to the voltage conversion circuit 130. The voltage conversion circuit is configured to output a first input signal Si1 to the first circuit 110, then the first circuit 110 accordingly outputs a first output signal S02. The above voltage conversion circuit 130 performs a "boost" process.

Figure 1B:
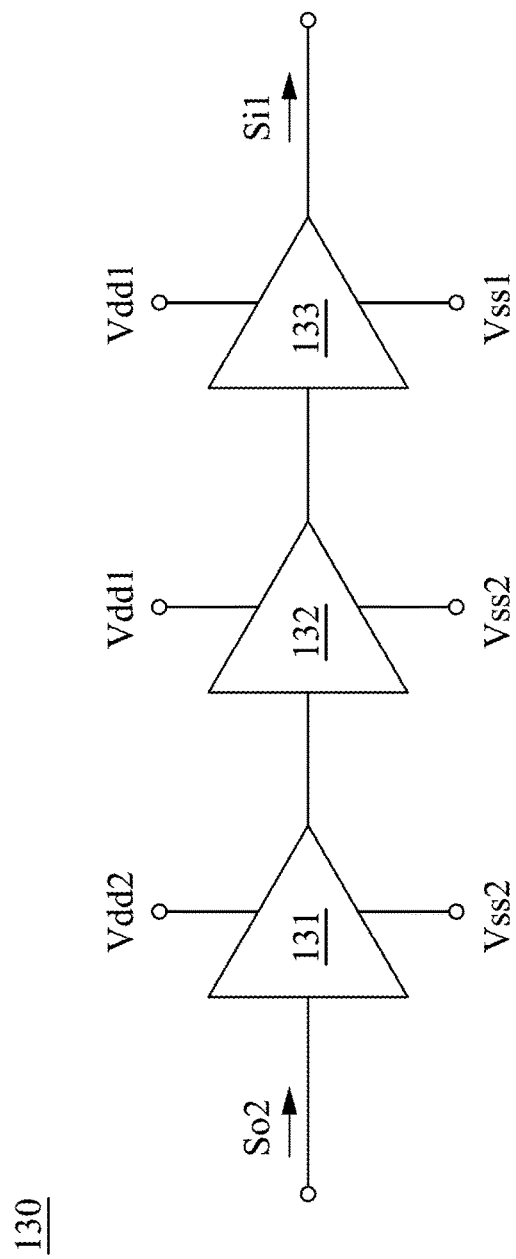
FIG. 1B is a schematic diagram of a voltage conversion circuit in some embodiments of the present disclosure.
Figure 1C:
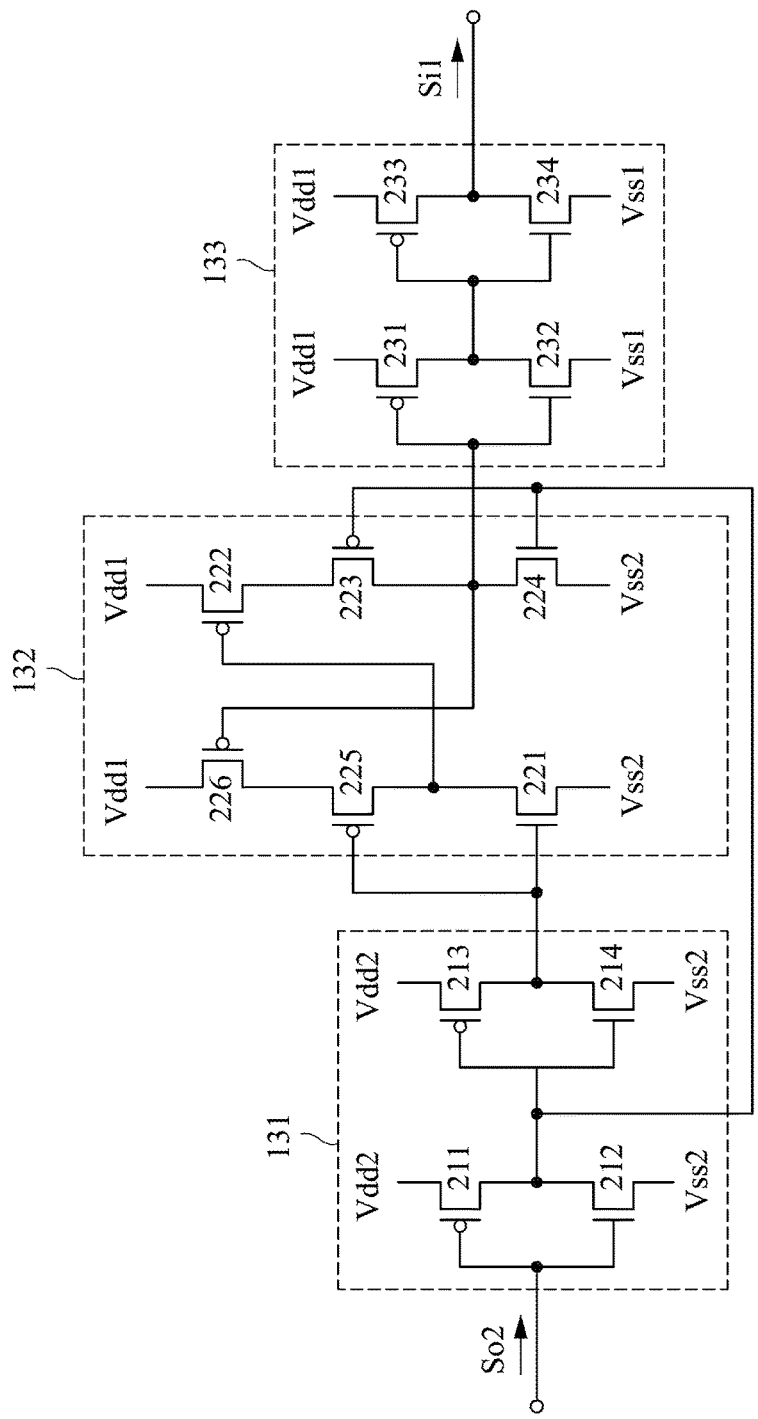
FIG. 1C is a schematic diagram of a voltage conversion circuit in some embodiments of the present disclosure.

To facilitate the description of the implementation of the present disclosure, the operation and circuit details of "buck" and "boost" are described here. FIG. 1A-1C is the "boost" embodiment in the present disclosure. In some embodiments, the voltage conversion circuit 130 includes a buffer circuit 131, a first conversion circuit 132, and a second conversion circuit 133. The first high potential signal Vdd1 (e.g., 2.4 volts) is larger than the second high potential signal Vdd2 (e.g., 1.2 volts). The voltage value of the first low potential signal Vss1 (e.g., 1.2 volts) is larger than the voltage value of the second low potential signal Vss2 (e.g., 0 volts). The voltage conversion circuit 130 is configured to receive the second output signal So2 output by the second circuit 120, and level up the disable voltage level of the second output signal So2 and the enable voltage level of the second output signal So2 to output the first input signal Si1 to the first circuit 110.

The buffer circuit 131 is configured to receive the second output signal So2 and transmit it to the first conversion circuit 132. In some embodiments, the buffer circuit 131 has two inverters connected in series, and includes a plurality of transistor switches 211 to 214. The inverter is electrically connected to the second high potential signal Vdd2 and the second low potential signal Vss2.

As mention above, the first conversion circuit 132 is electrically connected to the second circuit 120 through the buffer circuit 131, and configured to receive the second output signal So2. The first conversion circuit 132 adjusts the enable voltage level of the second output signal So2 according to the first high potential signal Vdd1 and the second low potential signal Vss2. As shown in FIG. 1C, in some embodiments, the first conversion circuit 132 includes a plurality of transistor switches 221 to 226. When the second output signal So2 is a second low potential signal Vss2 (e.g., 0 volts), the transistor switches 221, 222, and 223 are all turned off, and the transistor switches 224, 225, and 226 are kept turned on, so that the signal output form the first conversion circuit 132 to the second conversion circuit 133 is maintained at the second low potential signal Vss2. When the second output signal So2 is second high potential signal Vdd2 (e.g., 1.2 volts), the transistor switches 221, 222, 223 are all turned on, and the transistor switches 224, 225, 226 are turned off, so that the signal output from the first conversion circuit 132 to the second conversion circuit 133 is raised to the first high potential signal Vdd1.

The second conversion circuit 133 is electrically connected to the first conversion circuit 132, and configured to receive the adjusted second output signal So2. The second conversion circuit 133 includes multiple transistor switches 231 to 234 which are two inverters connected in series in other embodiments. The second conversion circuit 133 adjusts the disable voltage level of the adjusted second output signal So2 according to the first high potential signal Vdd1 and the first low potential signal Vss1 to generate the first input signal Si1. For example, when the signal received by the second conversion circuit 133 is the second low potential signal Vss2 (e.g., 0 volt), the transistor switches 231, 234 are turned on; the transistor switches 232, 233 are turned off, so the output first input signal Si1 will have the first low potential signal Vss1 (e.g., 1.2 volts).

Figure 2B:
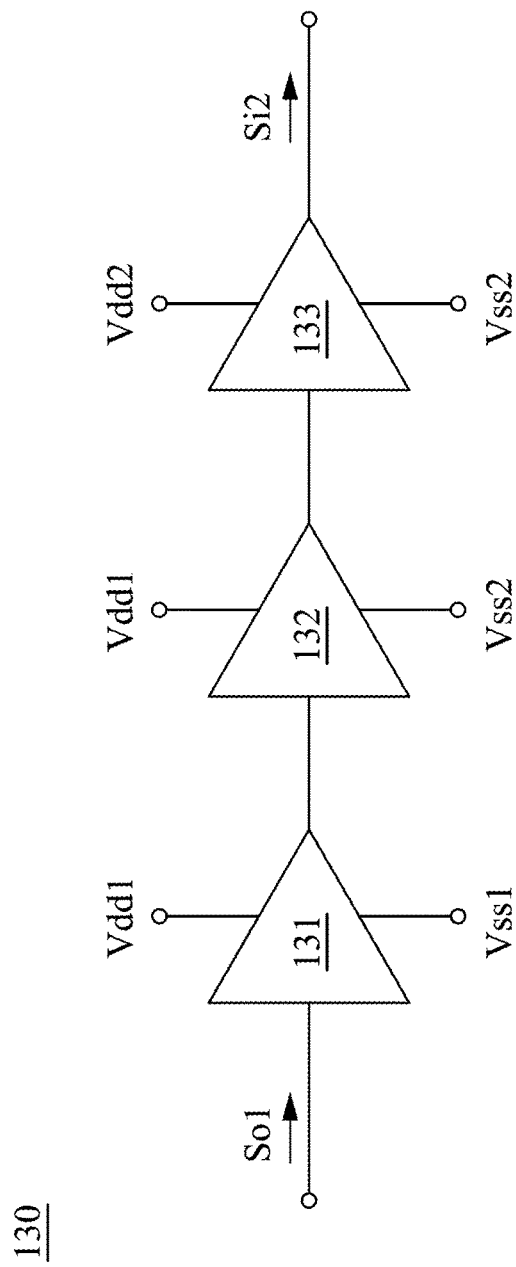
FIG. 2B is a schematic diagram of a voltage conversion circuit in some embodiments of the present disclosure.
Figure 2C:
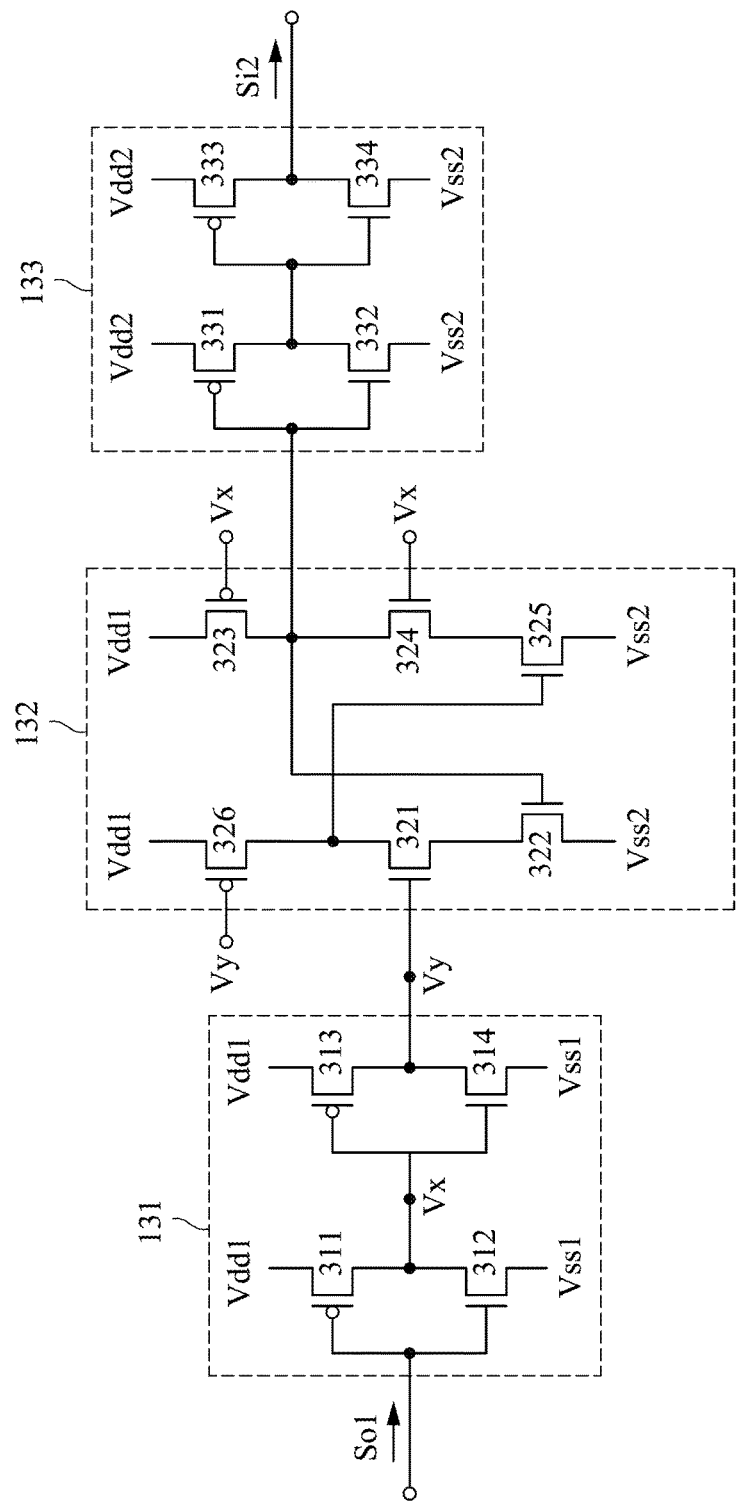
FIG. 2C is a schematic diagram of a voltage conversion circuit in some embodiments of the present disclosure.

FIG. 2A-2C is the "buck" embodiment in the present disclosure. In some embodiments, the voltage conversion circuit 130 includes a buffer circuit 131, a first conversion circuit 132 and a second conversion circuit 133. In some embodiments, the first high potential signal Vdd1 (e.g., 2.4 volts) is larger than the second high potential signal Vdd2 (e.g., 1.2 volts). The voltage value of the first low potential signal Vss1 (e.g., 1.2 volts) is larger than the voltage value of the second low potential signal Vss2 (e.g., 0 volts). The voltage conversion circuit 130 is configured to receive the first output signal So1 output by the first circuit 110, and to level down the disable voltage level of the first output signal So1 and the enable voltage level of the first output signal So1 to output the second input signal Si2 to the second circuit 120.

The buffer circuit 131 is configured to receive the first output signal So1 and transmit to the first conversion circuit 132. In some embodiments, the buffer circuit 131 includes multiple transistor switches 311-314, wherein the transistors 311, 312 may form a first inverter, and the transistors 313, 314 may form a second inverter. The input terminal of the first inverter is configured to receive the first output signal So1. The input terminal of the second inverter is electrically connected to the output of the first inverter. The output terminal of the second inverter is electrically connected to the first conversion circuit 132. That is, the first inverter and the second inverter are connected in series, and the inverters are electrically connected to the first high potential signal Vdd1 and the first low potential signal Vss1.

As mention above, the first conversion circuit 132 is electrically connected to the first circuit 110 through the buffer circuit 131, and configured to receive the first output signal So1. The first conversion circuit 132 adjusts the disable voltage level of the second output signal So2 according to the first high potential signal Vdd1 and the second low potential signal Vss2. The second conversion circuit 133 is electrically connected to the first conversion circuit 132, and configured to receive the adjusted first output signal So1, and adjust the enable voltage level of the adjusted first output signal So1 according to the second high potential signal Vdd2 and the second low potential signal Vss2 in order to generate the second input signal Si2. The in some embodiments, the second conversion circuit 133 includes multiple transistor switches 331 to 334. Since the operation principle is the same as that of the second conversion circuit 133 shown in FIG. 1C, it will not be described herein.

Referring to FIG. 2C, in some embodiments, the first conversion circuit 132 includes a first switching transistor 326 and a second switching transistor 323. The positive terminal of the first switching transistor 326 is electrically connected to the first high potential signal Vdd1. The negative terminal of the first switching transistor 326 is electrically connected to the second low potential signal Vss2 through a first switching circuit formed by the transistor switches 321, 322. The control terminal of the first switching transistor 326 is electrically connected to the output terminal of the second inverter to be turned on or off according to the voltage level Vy of the output terminal of the second inverter.

The positive terminal of the second switching transistor 323 is electrically connected to the first high potential signal Vdd1. The second switching transistor 323 is electrically connected to the second low potential signal Vss2 through the second switching circuit formed by the transistor switches 324, 325. The control terminal of the second switching transistor 323 is electrically connected to the output terminal of the first inverter to be turned on or off according to the voltage level Vx of the output terminal of the first inverter.

In some embodiments, the first switching transistor 326 and the second switching transistor 323 are all P-type Metal-Oxide-Semiconductor Field-Effect Transistors. The first conversion circuit 132 is configured to convert the first low potential signal Vss1 to the second low potential signal Vss2. That is, the first conversion circuit 132 and the buffer circuit 131 are connected to the same high potential signal (Vdd1), but are respectively connected to different low potentials (the first low potential signal Vss1 is converted to the second low potential signal Vss2). Therefore, using P-type Metal-Oxide-Semiconductor Field-Effect Transistors as a switch will avoid the problem of voltage instability. In addition, the in some embodiments, the first switching circuit and the second switching circuit respectively include two N-type Metal-Oxide-Semiconductor Field-Effect Transistors cascaded to each other, like the transistor switches 321, 322, 324, and 325 in FIG. 2C.

In the above embodiments, the voltage conversion circuit 130 shown in FIG. 1A-1C is configured to "boost", the voltage conversion circuit 130 shown in FIG. 2A-2C is configured to "buck". However, in some other embodiments, the integrated circuitry 100 can include both a "boost" and a "buck" voltage conversion circuits. In the other hand, there may be two voltage conversion circuits between the first circuit 110 and the second circuit 120 so as to respectively perform the corresponding conversion for the signal between the first circuit 110 and the second circuit 120.

In addition, the circuits in FIGS. 1C and 2C are only some embodiments of the present disclosure, and the voltage conversion circuit 130 is not limited thereto. For example, the voltage conversion circuit 130 performing the "buck" process may be composed of two inverters connected in series, as long as the power supply positive terminal and the power supply negative terminal of the inverter are respectively connected to different supply voltages (as shown in FIG. 2B), it can also achieve the same effect. Since the person of the art can understand the principle and related circuit of the voltage conversion circuit and the level shifter, therefore it will not be described again here.

Referring to FIGS. 1A and 2A, in some embodiments, the first circuit 110 and the second circuit 120 may be respectively arranged in two Deep-Nwell regions W1 and W2 of the semiconductor substrate, and the voltage conversion circuit 130 is located between the Deep-Nwell regions W1, W2. In other partial embodiments (such as embossments shown in FIG. 2B-2C), the voltage conversion circuit 130 may be partially located in the Deep-Nwell regions W1, W2. For example, the buffer circuit 131 and the first conversion circuit 132 are located in the Deep-Nwell region W1, the second conversion circuit 133 is located in the Deep-Nwell region W2. However, the power supply positive terminal (ie, Vdd1, Vdd2) of the voltage conversion circuit 130 can not be located in the same Deep-Nwell region W1 or W2 so as to avoid forming a short circuit. Through the Deep-Nwell regions W1, W2, the transistor switches in the first circuit 110 and the transistor switches in the second circuit 120 can be prevented from interacting with each other due to Body Effect. However, the present disclosure is not limited to this, the integrated circuitry 100 will operate without the deep Deep-Nwell regions W1, W2.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. An integrated circuitry, comprising:
   a first circuit, a first power supply positive terminal of the first circuit electrically coupled to a power source;
   a second circuit electrically coupled in series with the first circuit and the power source, wherein a second power supply positive terminal of the second circuit is electrically coupled to a first power supply negative terminal of the first circuit; a second power supply negative terminal of the second circuit is electrically coupled to a reference potential voltage; and
   a voltage conversion circuit electrically coupled between the first circuit and the second circuit, wherein the voltage conversion circuit is configured to receive a signal from the first circuit or the second circuit, and convert a voltage value of the signal according to a first low potential signal of the first power supply negative terminal and a second low potential signal of the second power supply negative terminal.

2. The integrated circuitry of claim 1, wherein the voltage conversion circuit is configured to adjust an enable voltage level of the signal according to a first high potential signal and a second high potential signal, and adjust a disable voltage level according to the first low potential signal and the second low potential signal.

3. The integrated circuitry of claim 2, wherein the voltage conversion circuit is electrically connected to the first power supply positive terminal so as to receive the first high potential signal; the voltage conversion circuit is electrically connected to the second power supply positive terminal so as to receive the second high potential signal.

4. The integrated circuitry of claim 2, wherein the first high potential signal is larger than the second high potential signal, the first low potential signal is larger than the second low potential signal; the voltage conversion circuit is configured to receive a first output signal output by the first circuit, and is configured to level down an enable voltage level of the first output signal and a disable voltage level of the first output signal, so that the voltage conversion circuit is configured to output a second input signal to the second circuit.

5. The integrated circuitry of claim 4, wherein the voltage conversion circuit further comprises:
   a first conversion circuit electrically connected to the first circuit, and configured to receive the first output signal, the first conversion circuit further configured to adjust the disable voltage level of the first output signal according to the first high potential signal and the second low potential signal; and
   a second conversion circuit electrically connected to the first circuit, and configured to receive the adjusted first output signal, the second conversion circuit further configured to adjust the enable voltage level of the adjusted first output signal according to the second high potential signal and the second low potential signal so as to generate the second input signal.

6. The integrated circuitry of claim 5, wherein the voltage conversion circuit further comprises:
   a buffer circuit comprising a first inverter and a second inverter, wherein an input terminal of the first inverter is configured to receive the first output signal, an input terminal of the second inverter is electrically connected to an output terminal of the first inverter, and an output terminal of the second inverter is electrically connected to the first conversion circuit.

7. The integrated circuitry of claim 6, wherein the first conversion circuit further comprises:
   a first switching transistor, a positive terminal of the first switching transistor is electrically connected to the first high potential signal, a negative terminal of the first switching transistor is electrically connected to the second low potential signal through a first switching circuit, and the first switching transistor turned on or turned off accordingly to a voltage level of the output terminal of the second inverter; and
   a second switching transistor, a positive terminal of the second switching transistor is electrically connected to the first high potential signal, a negative terminal of the second switching transistor is electrically connected to the second low potential signal through a second switching circuit, and the second switching transistor turned on or turned off accordingly to a voltage level of the output terminal of the first inverter.

8. The integrated circuitry of claim 7, wherein the first switching transistor and the second switching transistor are P-type Metal-Oxide-Semiconductor Field-Effect Transistors.

9. The integrated circuitry of claim 7, wherein the first switching circuit and the second switching circuit respectively comprise two N-type Metal-Oxide-Semiconductor Field-Effect Transistors cascaded to each other.

10. The integrated circuitry of claim 2, wherein the first high potential signal is larger than the second high potential signal, the first low potential signal is larger than the second low potential signal; the voltage conversion circuit is configured to receive a second output signal output by the second circuit, and is configured to level down an enable voltage level of the second output signal and a disable voltage level of the second output signal, so that the voltage conversion circuit is configured to output a first input signal to the first circuit.

11. The integrated circuitry of claim 10, wherein the voltage conversion circuit further comprises:
   a first conversion circuit electrically connected to the first circuit, and configured to receive the second output signal, the first conversion circuit is further configured to adjust the disable voltage level of the second output signal according to the first high potential signal and the second low potential signal; and
   a second conversion circuit electrically connected to the first circuit, and configured to receive the adjusted second output signal, the second conversion circuit is further configured to adjust the disable voltage level of the adjusted second output signal according to the first high potential signal and the first low potential signal so as to generate the first input signal.

12. The integrated circuitry of claim 1, wherein the first circuit and the second circuit are respectively arranged in two Deep-Nwell regions of a semiconductor substrate, the voltage conversion circuit is located between the Deep-Nwell regions.

\* \* \* \* \*